(12) United States Patent
Bains et al.

(10) Patent No.: US 9,299,400 B2
(45) Date of Patent: *Mar. 29, 2016

(54) DISTRIBUTED ROW HAMMER TRACKING

(71) Applicant: Intel Corporation, Santa Clara, CA (US)

(72) Inventors: Kuljit S. Bains, Olympia, WA (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 144 days.

This patent is subject to a terminal disclaimer.

(21) Appl. No.: 13/631,781

(22) Filed: Sep. 28, 2012

(65) Prior Publication Data

US 2014/0095780 A1 Apr. 3, 2014

(51) Int. Cl.
| | |
|---|---|
| *G11C 13/00* | (2006.01) |
| *G11C 7/10* | (2006.01) |
| *G11C 11/406* | (2006.01) |
| *G11C 11/4078* | (2006.01) |

(52) U.S. Cl.
CPC ............ *G11C 7/1072* (2013.01); *G11C 11/406* (2013.01); *G11C 11/4078* (2013.01); *G11C 11/40611* (2013.01)

(58) Field of Classification Search
CPC .................................................... G11C 11/406
USPC ........................................................ 365/222
See application file for complete search history.

(56) References Cited

U.S. PATENT DOCUMENTS

| | | | |
|---|---|---|---|
| 6,058,061 A * | 5/2000 | Ooishi .......................... 365/222 |
| 6,317,352 B1 | 11/2001 | Halbert et al. | |
| 6,487,102 B1 | 11/2002 | Halbert et al. | |
| 6,530,006 B1 | 3/2003 | Dodd et al. | |
| 6,766,385 B2 | 7/2004 | Dodd et al. | |
| 6,928,593 B1 | 8/2005 | Halbert et al. | |
| 6,952,745 B1 | 10/2005 | Dodd et al. | |
| 6,954,822 B2 | 10/2005 | Bains et al. | |
| 6,990,036 B2 | 1/2006 | Halbert et al. | |
| 6,996,749 B1 | 2/2006 | Bains et al. | |
| 7,024,518 B2 | 4/2006 | Halbert et al. | |
| 7,050,351 B2 | 5/2006 | Halbert et al. | |
| 7,054,999 B2 | 5/2006 | Bains et al. | |
| 7,221,609 B1 | 5/2007 | Bains | |
| 7,260,007 B2 | 8/2007 | Jain et al. | |
| 7,281,079 B2 | 10/2007 | Bains et al. | |
| 7,342,841 B2 | 3/2008 | Jain et al. | |
| 7,349,233 B2 | 3/2008 | Bains et al. | |
| 7,353,329 B2 | 4/2008 | Ellis et al. | |
| 7,386,765 B2 | 6/2008 | Ellis et al. | |

(Continued)

FOREIGN PATENT DOCUMENTS

WO    WO 2013/147746 A1    10/2013

*Primary Examiner* — Min Huang

(74) *Attorney, Agent, or Firm* — Blakely, Sokoloff, Taylor & Zafman LLP

(57) ABSTRACT

A memory controller issues a targeted refresh command in response to detection by a distributed detector. A memory device includes detection logic that monitors for a row hammer event, which is a threshold number of accesses to a row within a time threshold that can cause data corruption to a physically adjacent row (a "victim" row). The memory device sends an indication of the row hammer event to the memory controller. In response to the row hammer event indication, the memory controller sends one or more commands to the memory device to cause the memory device to perform a targeted refresh that will refresh the victim row.

28 Claims, 9 Drawing Sheets

(56) References Cited

U.S. PATENT DOCUMENTS

| | | |
|---|---|---|
| 7,404,055 B2 | 7/2008 | Bains et al. |
| 7,432,731 B2 | 10/2008 | Bains et al. |
| 7,454,586 B2 | 11/2008 | Shi et al. |
| 7,617,356 B2 | 11/2009 | Bains |
| 7,644,344 B2 | 1/2010 | Bains |
| 7,734,985 B2 | 6/2010 | Bains |
| 7,774,684 B2 | 8/2010 | Bains |
| 7,810,013 B2 | 10/2010 | Bains |
| 7,872,892 B2 | 1/2011 | MacWilliams et al. |
| 8,006,033 B2 | 8/2011 | Bains |
| 8,108,761 B2 | 1/2012 | Bains et al. |
| 8,130,576 B2 | 3/2012 | Bains et al. |
| 8,132,074 B2 | 3/2012 | Bains et al. |
| 8,161,356 B2 | 4/2012 | Bains et al. |
| 8,196,009 B2 | 6/2012 | Bains et al. |
| 8,289,797 B2 | 10/2012 | Jain et al. |
| 8,392,650 B2 | 3/2013 | Bains |
| 8,411,523 B2 | 4/2013 | Bains |
| 8,484,410 B2 | 7/2013 | Bains et al. |
| 8,533,538 B2 | 9/2013 | Chaudhuri et al. |
| 8,738,993 B2 | 5/2014 | Bains |
| 8,775,725 B2 | 7/2014 | Bains |
| 8,862,973 B2 | 10/2014 | Bains et al. |
| 2004/0236921 A1 | 11/2004 | Bains |
| 2005/0018473 A1* | 1/2005 | Aoki ............................ 365/154 |
| 2007/0130374 A1 | 6/2007 | Bains et al. |
| 2007/0150667 A1 | 6/2007 | Bains et al. |
| 2008/0228999 A1* | 9/2008 | Qawami ....................... 711/103 |
| 2009/0313533 A1 | 12/2009 | Bains |
| 2011/0216600 A1* | 9/2011 | Goda et al. ............... 365/185.19 |
| 2011/0235410 A1* | 9/2011 | Sharon et al. ............ 365/185.02 |
| 2012/0069687 A1* | 3/2012 | Koshizuka ................. 365/193 |
| 2012/0300570 A1* | 11/2012 | Kim et al. .................... 365/222 |
| 2013/0304982 A1* | 11/2013 | Jung et al. .................... 711/106 |
| 2014/0003173 A1* | 1/2014 | Ku .............................. 365/200 |
| 2014/0006703 A1 | 1/2014 | Bains et al. |
| 2014/0006704 A1 | 1/2014 | Greenfield et al. |
| 2014/0085995 A1 | 3/2014 | Greenfield et al. |
| 2014/0089576 A1 | 3/2014 | Bains et al. |
| 2014/0095780 A1 | 4/2014 | Bains et al. |
| 2014/0156923 A1 | 6/2014 | Bains et al. |

\* cited by examiner

COMMAND TRUTH TABLE 500

| FUNCTION | ABBR | CKE Prev Cycle | CKE Current Cycle | CS_n | ACT_n | RAS_n/A16 | CAS_n/A15 | WE_n/A14 | BG0-BG1 | BA0-BA1 | C2-C0 | A12/BC_n | A17, A13, A11 | A10/AP | A0-A9 |
|---|---|---|---|---|---|---|---|---|---|---|---|---|---|---|---|
| Mode Register Set | ABBR | H | H | L | H | L | L | L | BG | BA | V | OP CODE | | | |
| Refresh | REF | H | H | L | H | L | L | H | V | V | V | V | V | V | V |
| Self Refresh Entry | SRE | H | L | L | H | L | L | H | V | V | V | V | V | V | V |
| Self Refresh Exit | SRX | L | H | H | X | X | X | X | X | X | X | X | X | X | X |
| | | | | L | H | H | H | H | V | V | V | V | V | V | V |
| Single Bank Precharge | PRE | H | H | L | H | L | H | L | BG | BA | V | V | L | V | V |
| Precharge all Banks | PREA | H | H | L | H | L | H | L | V | V | V | V | V | H | V |
| RFU | RFU | H | H | L | H | L | H | H | RFU | | | | | | |
| Bank Activate | ACT | H | H | L | L | ROW ADDRESS | | | BG | BA | V | ROW ADDRESS | | | |
| Row Hammer | ACT_RH | H | H | L | L | ROW ADDRESS | | | BG | BA | V | ROW ADDRESS | | | |
| Write (Fixed BL4 or BL8) | WR | H | H | L | H | H | L | L | BG | BA | V | V | V | L | CA |
| Write (BL4, on the Fly) | WRS4 | H | H | L | H | H | L | L | BG | BA | V | L | V | L | CA |
| Write (BL8, on the Fly) | WRS8 | H | H | L | H | H | L | L | BG | BA | V | H | L | L | CA |
| Write with Auto Precharge (Fixed BL8 or BL4) | WRA | H | H | L | H | H | L | L | BG | BA | V | V | V | H | CA |
| Write with Auto Precharge (BL4, on the Fly) | WRAS4 | H | H | L | H | H | L | L | BG | BA | V | L | V | H | CA |
| Write with Auto Precharge (BL8, on the Fly) | WRAS8 | H | H | L | H | H | L | L | BG | BA | V | H | V | H | CA |
| Read (Fixed BL8 or BL4) | RD | H | H | L | H | H | L | H | BG | BA | V | V | V | L | CA |
| Read (BL4, on the Fly) | RDS4 | H | H | L | H | H | L | H | BG | BA | V | L | V | L | CA |
| Read (BL8, on the Fly) | RDS8 | H | H | L | H | H | L | H | BG | BA | V | H | L | L | CA |
| Read with Auto Precharge (Fixed BL8 or BL4) | RDA | H | H | L | H | H | L | H | BG | BA | V | V | V | H | CA |
| Read with Auto Precharge (BL4, on the Fly) | RDAS4 | H | H | L | H | H | L | H | BG | BA | V | L | V | H | CA |
| Read with Auto Precharge (BL8, on the Fly) | RDAS8 | H | H | L | H | H | L | H | BG | BA | V | H | V | H | CA |
| No Operation | NOP | H | H | L | H | H | H | H | V | V | V | V | V | V | V |
| Device Deselected | DES | H | H | H | X | X | X | X | X | X | X | X | X | X | X |
| Power Down Entry | PDE | H | L | H | V | X | X | X | X | X | X | X | X | X | X |
| Power Down Exit | PDX | L | H | H | X | X | X | X | X | X | X | X | X | X | X |
| ZQ Calibration Long | ZQCL | H | H | L | H | H | H | L | V | V | V | V | V | H | V |
| ZQ Calibration Short | ZQCS | H | H | L | H | H | H | L | V | V | V | V | V | L | V |

FIG. 5

DISTRIBUTED ROW HAMMER TRACKING

FIELD

Embodiments of the invention are generally related to memory management, and more particularly to monitoring row hammer events with distributed detection.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

BACKGROUND

With advances in computing technology, computing devices are smaller and have much more processing power. Additionally, they include more and more storage and memory to meet the needs of the programming and computing performed on the devices. The shrinking size of the devices together with the increased storage capacity is achieved by providing devices with higher density, where there are more and more atomic storage units within a memory device, but each has smaller and smaller geometries.

Within the latest generation of increased density devices, intermittent failure has appeared in some devices. For example, some existing DDR3 (dual data-rate, version 3) based systems experience intermittent failures with heavy workloads. Researchers have traced the failures to repeated access to a single row of memory within the refresh window of the memory cell. For example, for a 32 nm process, if a row is accessed 550K times or more in the 64 ms refresh window, the physically adjacent wordline to the accessed row has a high probability of experiencing data corruption. The condition has been referred to as "row hammer" or "single row disturb" in the DRAM (dynamic random access memory) industry, where the condition is most frequently observed. The row hammering can cause migration across the passgate. The leakage and parasitic currents caused by the repeated access to one row cause data corruption in a non-accessed physically adjacent row.

One approach identified to deal with the failure due to row hammer is to limit the number of accesses allowed per row per refresh cycle, which has performance impacts in the system. Another approach identified to address the row hammer failure includes decreasing the bottom critical dimension (BCD) in the buried channel array transistor (BCAT), and/or increasing channel length to improve the drain induced barrier lowering (DIBL). However, changing the dimension sizes of the devices has both physical and practical limitations. To the extent certain dimensions may now be changed, it would still require changes to the manufacturing processes. Also, it leaves open the question of how to address the issue in next-generation products.

Another approach to dealing with the row hammer issue is to decrease the time between refreshes. However, the refresh time has already been held constant even as the density of the devices has increased. Current devices are required to perform refresh on larger and larger areas in the same period of time. Thus, further decreasing the refresh time would cause a performance impact in the system, such as by requiring additional refresh overhead in the memory devices.

Thus, the approaches that attempt to prevent the row hammer condition by device design or changes to the operating parameters have significant limitations. However, detecting the row hammer condition in an operating device presents other challenges.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 5 is an embodiment of a command truth table supporting a targeted refresh command.

Figure 1:
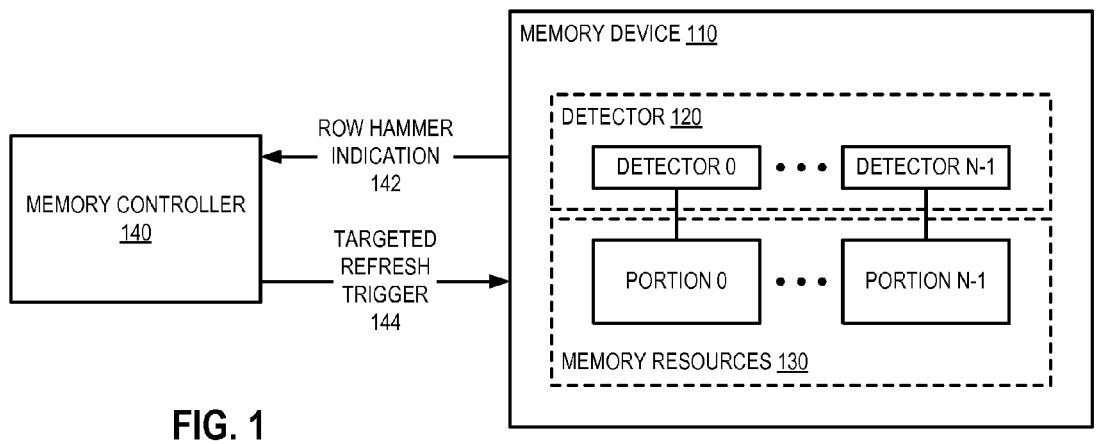
FIG. 1 is a block diagram of an embodiment of a system that performs a targeted refresh in response to distributed row hammer event detection.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory device includes detection logic that monitors for a row hammer event. When a specific row of a memory device is repeatedly accessed within a certain time window, a physically adjacent row may experience data corruption. The repeated access within the time window is referred to herein as a row hammer event or row hammer condition. The physically adjacent row is a victim row for the row hammer event. When the distributed detection logic at the memory device detects a row hammer event, the memory device sends an indication of the row hammer event to the memory controller. In response to the row hammer event indication, the memory controller triggers the memory device to perform a targeted refresh that will refresh the victim row.

Thus, instead of making design changes or changes to operating parameters of the memory devices, the system can provide an active runtime mechanism to monitor and address row hammer events. One such runtime mechanism is for the memory controller to monitor each access to determine if the number of accesses to any row causes a row hammer condition. However, having the memory controller monitor the accesses creates a burden on the memory controller, by increasing the logic and processing requirements of the memory controller.

In one embodiment, row hammer detection logic is on the memory device itself. For example, the memory device can include detection logic in a device that handles the command and address information coming into the memory device. For example, a C/A (command/address) register or buffer or other comparable device on an RDIMM (register DIMM) or LRDIMM (load reduction DIMM). In one embodiment, the system performs distributed monitoring or distributed tracking via such a C/A device, or other distributed logic. The logic can use any method to monitor and/or track accesses to portions of the memory, such as what is described below with respect to FIG. 8, or any other method.

As described in more detail below, the detection logic can be distributed across multiple logical portions of the memory device. Thus, even if all detection logic is executed in a C/A device, it can be considered distributed logic for purposes herein if it can monitor across different logical portions, each portion individually. The detection logic in the memory device alerts the memory controller when a row hammer event is detected. In one embodiment, the alert is triggered via a pulse width on an alert pin (e.g., ALERT#). In one embodiment, the memory device triggers the alert via setting the alert pin, and waiting for the memory controller to reset the alert pin. The memory controller can also poll the memory device in response to an alert to determine what alert is being indicated. In that way, multiple alerts could be generated on the same alert pin. Thus, for example, in current DDR DRAM designs, the host or the memory controller could differentiate between C/A parity error indication (asserted by a pulse width) and row hammer event indication if the row hammer indication is indicated either as a setting of the pin, or if it pulses the pin and awaits a poll.

In one embodiment, the memory controller configures the memory device to detect row hammer events. For example, the memory controller can program the threshold values for what number of accesses triggers a row hammer event in a register control word. In one embodiment, the memory controller programs a time window for the memory device to determine row hammer conditions. For example, in some memory subsystems, a time window different than the refresh window could be used. In other subsystems, the refresh window could be programmable. If the threshold of number of accesses is reached in the given time window, the memory device (e.g., via a C/A register device) sends the alert signal to the host (e.g., to the memory controller).

When the memory controller receives an indication of a row hammer condition from the memory device, the memory controller triggers a targeted refresh in the memory device for a victim row for the row hammer condition. There are many alternatives to how the memory controller can trigger the targeted refresh. In one embodiment, the memory controller issues a row hammer refresh command to the memory device and indicates an address that triggered the row hammer condition. The memory controller can obtain the address from the C/A device in the memory device (e.g., via reading a control word). The memory controller can specify an exact address of the row that caused the row hammer condition and allow the memory device to resolve what row(s) are victim(s) (or physically adjacent). Alternatively, the memory controller could determine the specific victim row address. The memory controller can send an address that identifies a region of memory instead of the exact location of the row that triggered the row hammer condition.

In one embodiment, the memory controller issues a trigger to cause the memory device to generate a row hammer command. For example, the memory controller can write to a control bit in a C/A device, which can in turn generate a row hammer refresh command. Such a trigger would require less processing on the part of the memory controller, but more processing by the memory device. However, if the memory device has detected the row hammer event, it should have the address of the row that caused the row hammer event, and so could issue the command without having to exchange the address back and forth between the memory device and memory controller. In an alternative embodiment, the memory controller issues a row hammer refresh command (also referred to as a targeted refresh command) without including address information. The memory device (e.g., via the C/A device) can provide the address information and forward the command to the memory resources that will execute the targeted refresh.

It will be understood that reference to a C/A device is non-limiting. The distributed row hammer event management can be implemented in a C/A register of an RDIMM subsystem, a C/A register of an LRDIMM subsystem, a buffer of a buffer-on-boards (BoB) implementation, a logic buffer device in a 3DS (three-dimensional stacking) configuration, or some other device that handles command and address information.

As mentioned above, the memory controller can send a targeted refresh trigger that does or does not include address information. The address information can indicate what row is getting hammered, and thus not have to directly indicate the victim row (or the target of the targeted refresh command). In a typical refresh scenario, the memory device itself tracks what needs to be refreshed when. Thus, the memory device itself can calculate what victim row or rows will be affected by the row hammer event based on the memory layout used by the memory device. The memory device refreshes the victim row(s) by opening the row and then closing the row(s) to refresh.

It will be understood that for the memory controller to indicate an address of the hammered row to cause the memory device to refresh victim row(s) of the hammered row requires a certain number of bits to identify a specific address. In one embodiment, the memory controller identifies a specific address. In another embodiment, the memory controller identifies an area larger than a specific row. Thus, a memory controller can identify a specific block, a specific row, or an area, depending on the chosen configuration. The cost of identifying a very specific address is the number of bits required. The cost of identifying the address more generally is that the memory device needs to refresh a larger area, making the memory device unavailable for a longer refresh time.

In one embodiment, the memory controller indicates address information by sending address information to the memory device. In one embodiment, one or more additional pins or lines can be added between the memory controller and the memory device embeds address information into an existing command to identify address information. Thus, the targeted refresh command can be a modified existing command and/or a modified existing command in conjunction with the use of one or more additional pins or lines. In one embodiment, the targeted refresh command includes sending a command and address multiple times (e.g., three times). In one embodiment, the address can be modified in the successive commands (e.g., sending the address+1 and then the address−1 in two successive commands). Other embodiments are possible. In one embodiment, the memory controller sends a targeted refresh command, which the memory device separates into one or more groups of Activate and Precharge commands. Other commands could be doubled-up for targeted refresh purposes.

The theoretical maximum number of times a row can be accessed within a 64 ms window (e.g., a refresh window) is 1.35 million times (64 ms refresh window divided by 47 ns access time) for current DRAMs (dynamic random access memory). The practical maximum without risking data corruption in the victim rows is much lower, and depends on the process technology used. However, by detecting a row hammer event and sending a targeted refresh command, the risk of data corruption can be reduced without restricting access to a specific row of memory.

The examples provided herein primarily discuss the row hammer issue with respect to DRAM. However, it will be understood that the row hammer issue is more generally a memory device scaling issue, which occurs as memory densities increase. Thus, the descriptions with respect to DRAM will be understood as non-limiting examples that can be applied to other memory technologies that include memory controller or equivalent logic. The targeted refresh command described herein is compatible with any of a number of memory technologies, such as DDR4 (dual data rate version 4, specification in development as of the filing of this application), LPDDR4 (low power dual data rate version 4, specification in development as of the filing of this application), or WIDEIO (specification in development as of the filing of this application).

In a memory device, rows that are physically adjacent can often be logically labeled differently from one manufacturer to another. Typically a manufacturer maps logically adjacent rows of memory by a physical address offset, and the offsets can be different among different manufacturers. The memory device itself is configured to determine how to map access requests to the physical memory resources. Memory controllers are generally designed to be compatible with many different types of memory devices, and so they are generally not designed specifically with respect to any particular manufacturer's device. Thus, memory controllers do not traditionally have logic or information to indicate what rows are physically adjacent. With distributed detection logic, the memory devices themselves can undertake some of the operations related to identifying hammered rows and the victim row(s), as well one or more operations related to generating a targeted refresh command.

FIG. 1 is a block diagram of an embodiment of a system that performs a targeted refresh in response to distributed row hammer event detection. System 100 includes memory device 110, which represents any of a variety of memory devices that include memory resources 130 separated in rows. The rows are separable into logical groups, such as portions 0 through N−1. Examples of memory include any of a variety of types of dynamic random access memory (DRAM).

In one embodiment, memory device 110 includes detector logic 120, which can include detector resources 0 through N−1, each one corresponding to a separate logical portion of memory resources 130. Detector 120 can be referred to as distributed detector logic. In one embodiment, detector 120 is implemented in hardware that also handles C/A management. Detector 120 monitors each portion of memory for row hammer conditions. If a row hammer condition is found, memory device 110, e.g., via detector 120, generates row hammer indication 142 to memory controller.

As is understood by those skilled in the art, memory controller 140 is implemented in hardware separate from memory resources 130, and memory device 110. Typically, memory controller 140 resides on a primary host hardware platform (e.g., a motherboard or other host board), while memory device 110 is typically connected to or inserted into a connector of the host hardware platform. Memory device 110 can be implemented as a memory module (e.g., a dual inline memory module (DIMM)).

Memory controller 140 and memory device 110 can be connected via one or more buses, or group of connections governed by a standard of communication (e.g., timing, signaling, protocol, or other inter-device management mechanisms). In one embodiment, memory device 110 sends row hammer indication 142 over one of the lines on a memory bus, for example, ALERT# signal line. On detecting the alert signal from memory device 110, memory controller 140 determines how to handle the alert.

In one embodiment, memory controller 140 issues one or more row hammer refresh commands to memory device 110. In one embodiment, memory controller 140 can determine address information for the refresh command from memory device 110. Such address information can be obtained, for example, by memory controller 140 reading control word(s) from registers in memory device 110, such as is possible in DDR4. In one embodiment, memory controller 140 sends a refresh command without address information, which can then be provided by memory device 110 prior to executing the refresh command. In one embodiment, memory controller 140 writes to a control bit in a register or buffer, e.g., the C/A register, of memory device 110, which in turn issues the row hammer command to the associated memory resources. For example, one C/A device on a memory module can control multiple DRAM devices on the memory module, and the C/A device can issue a targeted refresh command to be implemented by the DRAM device(s). The different possible embodiments and others not specifically described are generically referred to as targeted refresh trigger 144 send by memory controller 140 to memory device 110.

While not explicitly shown, it will be understood by those skilled in the art that memory device or memory module 110 and memory controller 140 include hardware connectors to couple to the other device. The hardware connectors can include pins, bumps, wires, pads, or other connection mechanisms. The hardware connectors enable connections to devices external to the connectors.

Detector 120 monitors each portion 0 through N−1 for repeated access to a specific row of memory. When the number of accesses to a specific row exceeds threshold within a time window (e.g., a refresh time window, or any other time window configured for the detector), it generates row hammer indication 142. Targeted refresh command 144 from memory controller 140 can include address information for the targeted refresh. The address information can be virtual address information, specific physical address information, address information specific to the victim row(s), address information to a region, range, or section of the portion of memory in which the row hammer event was detected, or address information that can be resolved by memory device 110 to identify the victim row(s). In one embodiment, memory controller 140 does not send address information.

Detector 120 can use any known or developed mechanism to determine the existence of a row hammer event. The mechanisms include some way of determining a number of times a row is accessed, as well as determining the period of time in which the accesses occur. The row hammer event is not simply about how many times a row is accessed, but how many times in a given time period. Once a row is refreshed, the conditions that could cause data corruption are overcome. Thus, in one embodiment, the time period for the monitoring is based at least in part on the refresh rate. Targeted refresh trigger 144 causes memory device 110 to perform a targeted refresh that can overcome the conditions that cause data corruption in between the normally scheduled refresh event that occurs periodically on the refresh cycle.

In one embodiment, memory controller 140 sets a value in a Mode Register in conjunction with sending targeted refresh trigger 144. A Mode Register is a register, or table, or other mechanism used to store configuration information for memory device 110. The configuration information can vary from one implementation to another, but different settings of the Mode Register can change how a given command sent on a command bus (e.g., a command/address (C/A) bus) is interpreted by memory device 110. In one embodiment, targeted refresh trigger 144 includes a specific command sent on the C/A bus together with setting a value in the Mode Register to trigger the memory device to interpret certain bits of the command as address bits.

Figure 2:
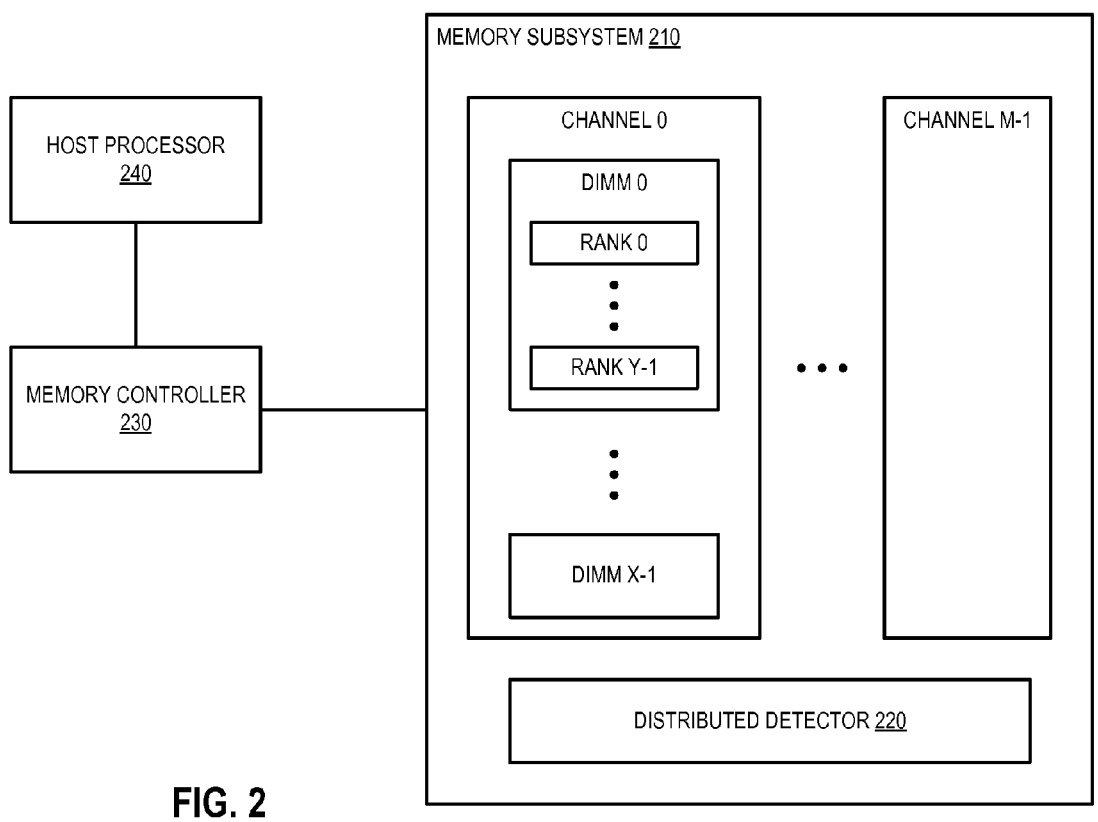
FIG. 2 is a block diagram of an embodiment of a system with distributed row hammer event detection.

FIG. 2 is a block diagram of an embodiment of a system with distributed row hammer event detection. System 200 illustrates one embodiment of a system with memory subsystem 210, memory controller 230, and host processor 240. System 200 can be one embodiment of an implementation of system 100.

In system 200, the memory "device" controlled by memory controller 230 is specifically illustrated as a memory subsystem. In one embodiment, a subsystem can be considered a "device" in that it includes hardware components. A subsystem includes multiple individual devices or sub-devices. Memory subsystem 210 can be an example of a memory subsystem in any type of computing system, such as a desktop or laptop device, a server device, a handheld or tablet device, a mobile phone or mobile gaming device, a gaming console, or other devices where memory is used. The devices can support many different types of logical separation of the memory resources. For example, memory subsystems in current computing devices can support multiple channels (e.g., up to four), multiple DIMMs per channel (e.g., up to 3 for DDR4), and multiple ranks per DIMM (16 ranks per DIMM for 3DS (three-dimensional stacking)).

System 200 performs row hammer event tracking for rows of memory in memory subsystem 210. However, tracking row hammer events given the potential complexity in logical partitioning of the memory resources can be very expensive in memory controller 230 in terms of logic and processing. As described herein, system 200 employs distributed tracking by using distributed detector 220 that can monitor different portions of the memory resources. For example, monitoring and detection can be performed per channel (for all M channels), per DIMM (for all X DIMMs for each channel) or other memory module, per rank (for all Y ranks for each DIMM), or by some other logical separation. In one embodiment, distributed detector 220 includes a C/A device or comparable device on each RDIMM (register DIMM) or LRDIMM (load reduction DIMM). Other implementations, including other separation of detector logic devices is possible.

It will be understood that memory controller 230 performs operations related to memory access of memory resources of memory subsystem 210 based on execution at host processor 240. Host processor 240 can be or include any type of single or multi-core processing unit, microprocessor, central processing unit (CPU), or other processor. Host processor 240 executes instructions (e.g., code) to perform operations on data and generate results or perform functions for system 200. Some instructions and data can be stored locally to host processor 240 (e.g., on a cache), and other data and instructions can be in memory subsystem 210 for use by host processor 240. Memory controller 230 interfaces between the memory subsystem and the host processor.

As mentioned above, in one embodiment, the memory controller (e.g., memory controller 230 in system 200) can identifies a specific address for a row that is the target of row hammering, and for which there will be one or more victim rows. The specific address can be a specific physical address. In one embodiment, the memory controller identifies a specific virtual memory address of the target row. In one embodiment, the memory controller only identifies a region associated with the hammered row. The region can be more specific than the specificity of any of the portions of memory resources illustrated within memory subsystem 210 (e.g., more specific than a DIMM or rank).

Figure 3A:
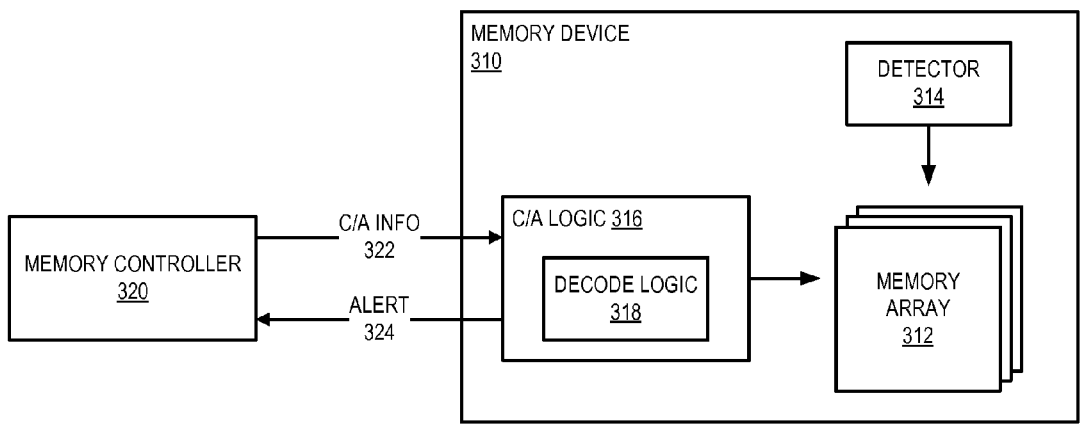
FIG. 3A is a block diagram of an embodiment of a system that includes column/address information logic at a memory device to indicate a detected row hammer event.

FIG. 3A is a block diagram of an embodiment of a system that includes column/address information logic at a memory device to indicate a detected row hammer event. System 300 is a system that includes a memory device or memory subsystem and a memory controller in accordance with any embodiment described herein. System 300 includes memory device 310 coupled to memory controller 320. Memory device 310 can include any type of memory technology that has adjacent rows of memory cells, where data is accessible via a wordline or the equivalent.

Memory device 310 includes memory array 312, which represents one or more logical and/or physical groups of memory (such as those illustrated in system 200). While not specifically shown in system 300, memory array 312 can include one or more rows that are the targets of repeated access within a time window. Such a row is subject to a row hammer condition. In many modern memory devices, the architecture of the semiconductor layout causes one or more physically adjacent rows (victim rows) to be at risk of becoming corrupted.

Memory device 310 includes C/A logic 316, which is used to decode access instructions to specific memory location(s) within memory array 312. C/A logic 316 includes decode logic 318 such as column logic and row logic, which activate memory locations for reading and/or writing. C/A logic 316 can be implemented as a C/A register (e.g., of an RDIMM or LRDIMM device), as a C/A buffer or other logic buffer (e.g., in a 3DS configuration or buffer-on-boards implementation), or other logic device. In one embodiment, C/A logic 316 is implemented as a logic buffer in a three-dimensional stacked memory device, such as a hybrid memory cube (HMC), where DRAM devices are stacked on top of the logic buffer.

Memory controller 320 sends commands or instructions (C/A info 322) to memory device 310 over a command bus (e.g., a command/address (C/A) bus), which are then interpreted by memory device 310. Memory device 310 decodes the command information to perform a variety of access functions within the memory, and decodes address information via decode logic 318. The logic accesses a specific location in memory with a combination of a column address strobe or signal (CAS) and a row address strobe or signal (RAS). Rows of memory can be implemented in accordance with known memory architectures or their derivatives. Briefly, a row of memory includes one or more addressable columns of memory cells, as identified by the CAS. The rows are addressable via the RAS.

Detector 314 represents hardware and/or software or other logic that enables memory device 310 to detect a row hammer event or row hammer condition. There can be multiple different mechanisms used to detect the row hammer condition. Detector 314 can include a table or log to monitor accesses to selected rows of memory. When a row hammer event or row hammer condition is detected, in one embodiment, C/A 316 generates alert signal 324 to indicate the condition to memory controller 320.

In response to the alert, memory controller 320 triggers a targeted refresh in response to detecting a row hammer event. The targeted refresh trigger can include a command and/or setting of a register value via C/A info 322. A targeted refresh occurs "off-schedule," meaning that the targeted refresh occurs in response to detecting the row hammer event as opposed to performing a refresh because a timer indicates it is time to perform a refresh. In one embodiment, memory controller 320 doubles up an existing command to send a targeted refresh command.

In one embodiment, memory controller 320 can configure the timeframe for which detector 314 is to monitor for a row hammer condition, as well as configure the number of accesses that define a row hammer event. In one embodiment, detector 314 maintains data for a subset of the total number of rows in memory device 310. In one embodiment, detector 314 maintains data for a number of rows based on MVC, which is the maximum victim count expected for the configured timeframe. For example, detector 314 can keep a table with MVC+1 entries, or more entries. Detector 314 can then roll entries into the table for memory locations that are accessed, rolling out the lowest-count entries in the table to replace them. A count of number of accesses can thus be maintained and compared against a threshold for a time period. More details of a specific implementation are described below with respect to FIG. 8.

Figure 3B:
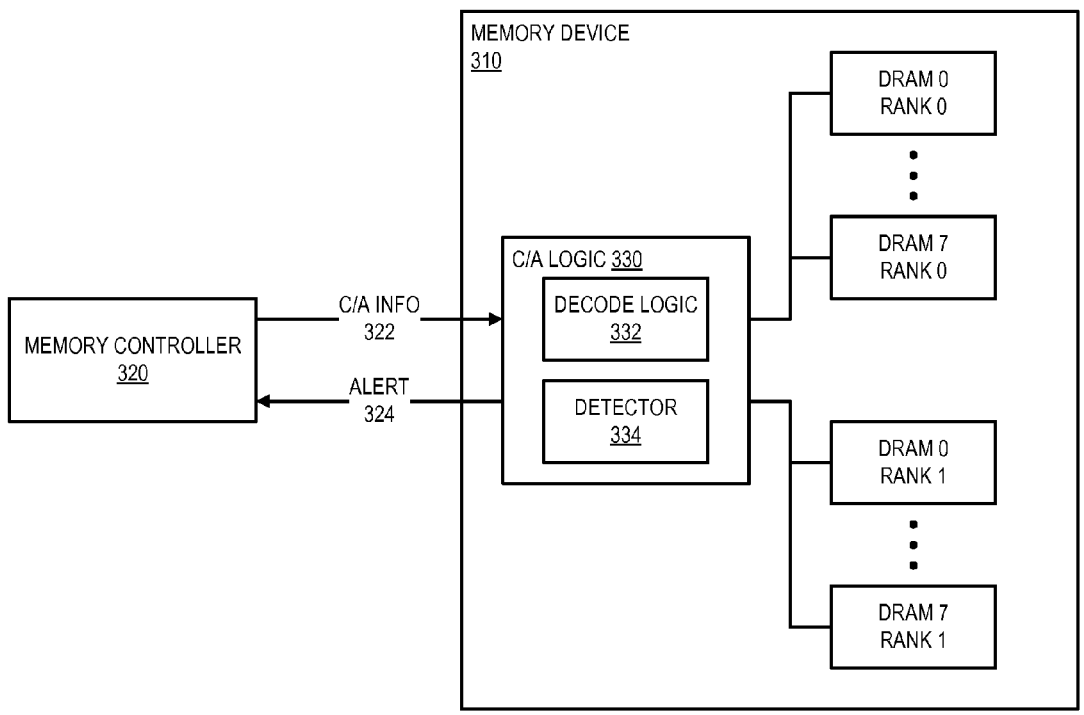
FIG. 3B is a block diagram of an embodiment of a system that includes column/address information logic including detector logic at a memory device to indicate a detected row hammer event.

FIG. 3B is a block diagram of an embodiment of a system that includes column/address information logic including detector logic at a memory device to indicate a detected row hammer event. System 350 is a system that includes a memory device or memory subsystem and a memory controller in accordance with any embodiment described herein. System 350 provides one example of an embodiment of system 300 of FIG. 3A.

More specifically with respect to system 350, in one embodiment the C/A logic is implemented as C/A logic 330, including decode logic 332 and detector 334. The functions of decode logic 332 can be equivalent to those of decode logic 318 of system 300. Detector 334 is specifically illustrated as being included in logic device C/A logic 330. Detector 334 still monitors for row hammer events or conditions, and triggers an alert to memory controller 320 when one is detected. Detector 334 can monitor by logical area, and can still be considered distributed, because its monitoring is distributed across the various logical portions of the memory resources.

In one embodiment, the memory resources (e.g., memory array 312) are divided up by rank and device. Thus, assuming eight DRAM or other memory devices per rank, memory device 310 is shown including DRAM 0 through DRAM 7 for rank 0, and rank 1 is also shown with DRAM 0 through DRAM 7. Other ranks and other logical divisions of the memory resources can be made instead of, or in addition to what is illustrated. In one embodiment, detector 334 monitors per DRAM.

Figure 4:
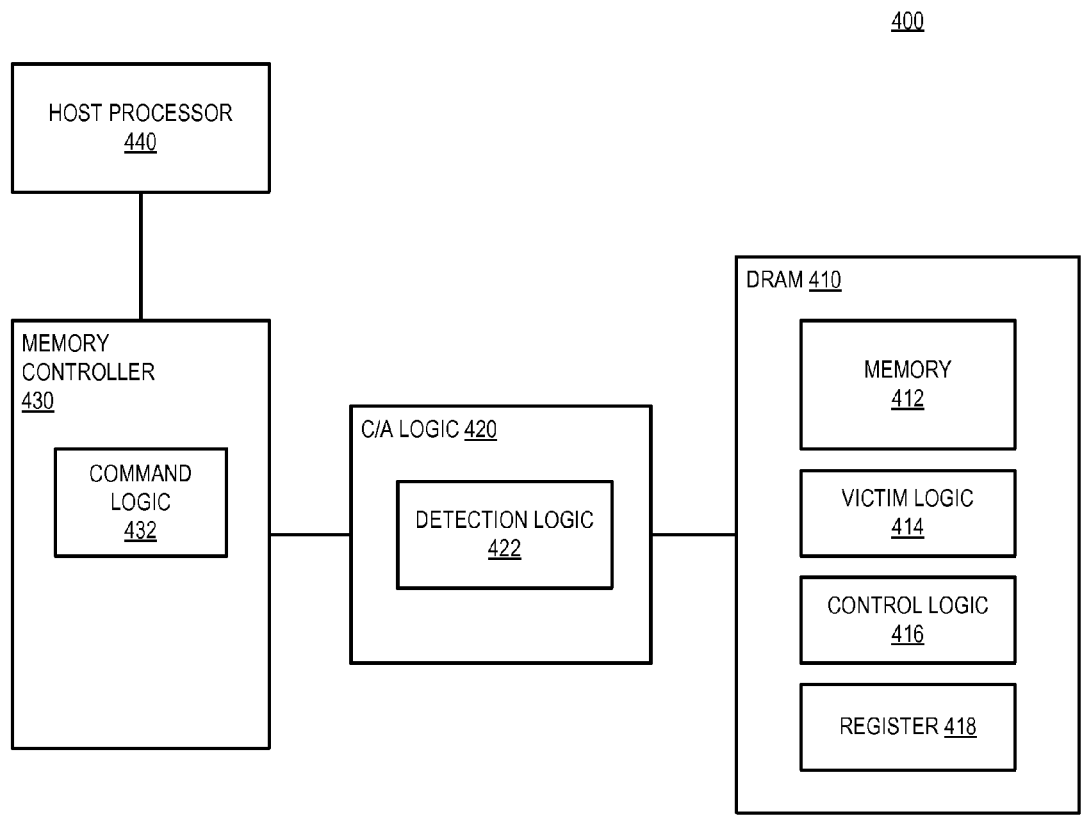
FIG. 4 is a block diagram of an embodiment of a system including distributed row hammer detection logic, and victim logic at a memory device.

FIG. 4 is a block diagram of an embodiment of a system including distributed row hammer detection logic, and victim logic at a memory device. System 400 can be one example of a memory subsystem in accordance with any embodiment described herein, such as system 100, system 200, system 300, and system 350 discussed above. System 400 illustrates one logical understanding of a memory subsystem.

DRAM 410 includes rows of memory in memory 412, which are rows of memory in accordance with known memory architectures or their derivatives. Briefly, a row of memory includes one or more addressable columns of memory cells. In one embodiment, DRAM 410 map logical address information from memory controller 430 to physical memory locations in memory 412. It is understood that memory is typically accessed in such a way that "adjacent" memory addresses provided by memory controller 430 (typically logical addresses) do not necessarily map to physically adjacent memory locations in DRAM 410. Rather, each adjacent memory address as provided by memory controller 430 maps to addresses that are located as some consistent offset. For example, addresses 0xX0h, 0xX1h, and 0xX2h could be located at physical locations 0xY0h, 0xY3h, and 0xY7h, respectively, where the offset is '4'. In the example, 'X' represents the higher bit information of the addresses as provided by the memory controller, and 'Y' represents the higher bit information of the addresses as mapped within DRAM 410. Thus, the memory device itself can determine the victim row based on the configuration of the device in conjunction with the address information provided by the memory controller with a targeted refresh command.

Host processor 440 can be any type of processing unit, processor, or microcontroller. Host processor 440 generally accesses DRAM 410 and other memory devices via memory controller 430. In one embodiment, memory controller 430 is part of host processor 440. In an alternate embodiment, memory controller 430 is part of a supporting "chipset" or hardware logic that provides an infrastructure for power and interface logic for a hardware platform of which host processor 440 is a part. In one embodiment, DRAM 410 is a volatile memory, or a memory device whose contents are non-deterministic if power is interrupted to the device. Thus, a volatile memory requires a regular power source to allow it to refresh the memory cells to keep the data from become lost or corrupted. As mentioned above, detection logic 422 enables system 400 to identify a row hammer condition to be able to respond to the row hammer condition with a targeted refresh. C/A logic 420 interfaces the commands from memory controller 430 with specific memory devices (such as DRAM 410).

DRAM 410 includes victim logic 414, which represents logic to determine what row or rows are at risk of corruption due to the row hammer condition. In one embodiment, victim logic 414 can be at least partially executed at memory controller 430. However, for the sake of broader interoperability between memory controller 430 and other types of memory devices, victim logic 414 generally resides at DRAM 410. Thus, memory controller 430 need only provide a targeted refresh trigger to DRAM 410 to cause a targeted refresh. DRAM 410 can use a map or other logic to determine what row or rows are potential victims.

DRAM 410 includes control logic 416, which includes logic to perform refresh of memory 412. Each memory device includes some logic to keep track of what memory cells have been refreshed, and what rows are next due for a refresh. Control logic 416 can implement the actual targeted refresh based on receiving a targeted refresh command.

DRAM 410 can include one or more registers 418, which allow for configuration of DRAM 410 and/or communication between DRAM 410 and memory controller 430. Memory controller 430 includes command logic 432. Command logic 432 enables memory controller 430 to read and/or write registers 418. In one embodiment, memory controller 430 triggers a targeted refresh by setting a value in a register 418 of DRAM 410 to cause the memory device to perform the targeted refresh.

FIG. 5 is an embodiment of a command truth table supporting a targeted refresh command. Command truth table 500 represents one example of a truth table for a memory device. More specifically, table 500 represents a working draft of a specification for DDR4 memory. In accordance with table 500, one embodiment of sending a targeted refresh trigger is for the memory controller to issues a targeted refresh command (row hammer command identified as command 530). In an alternative embodiment, a different mechanism is used to trigger the memory device to perform a targeted refresh. The column to the left identifies supported functions. The columns to the right identify the value of different signals to specify the identified functions.

Of particular note in table 500 for purposes of discussion here is command 530, which is Row Hammer. It will be observed that the illustrated embodiment of Row Hammer is identical to Bank Activate (the command above it), with the exception of the value of signal 510, ACT_n. In one embodiment, ACT_n is a pin not in previous memory standards. The signal on ACT_n indicates whether or not the command is Row Hammer or Bank Activate. It is shown as active-low, but could alternatively be configured to be active-high. Both commands can identify an address, as indicated by the row address bits.

It will be observed that the three columns labeled as 520 include RAS, CAS and WE signals. However, these commands can be controlled internally by the memory device itself. Thus, by multiplexing these signals with additional address information (address bits A16, A15, and A14, respectively), enables more address information to be provided to more particularly identify the address of the target of the row hammer condition.

When ACT is set (e.g., column 520), the memory device reads RAS/CAS/WE as row address information. When ACT is not set, the memory device reads RAS/CAS/WE as traditional memory access encoding. As mentioned above, the address information could be identified for block, specific row, or some other size area. The refresh can be as specific or as wide as desired for the system.

While the Activate command is shown as being doubled up by the use of signal ACT_n, Refresh or any other command could be used. Alternatively, a completely new command could be used for targeted refresh. As illustrated, the targeted refresh command can be said to be embedded in an Activate command. The memory device identifies the victim row based on the address inside command 530.

In one embodiment, prior to setting command 530 on a C/A bus to the memory device, the memory controller places the memory device in a 'row hammer mode' via a Mode Register bit or bits. In one embodiment, the memory controller provides row address along with bank group and bank address to the memory device. The memory device performs a targeted refresh using the address provided to the physical row adjacent to the address. After allowing a period of time for the refresh command to occur (see FIG. 5 below), the memory controller can then remove the memory device from 'row hammer mode' by resetting the MR bit.

Figure 6A:
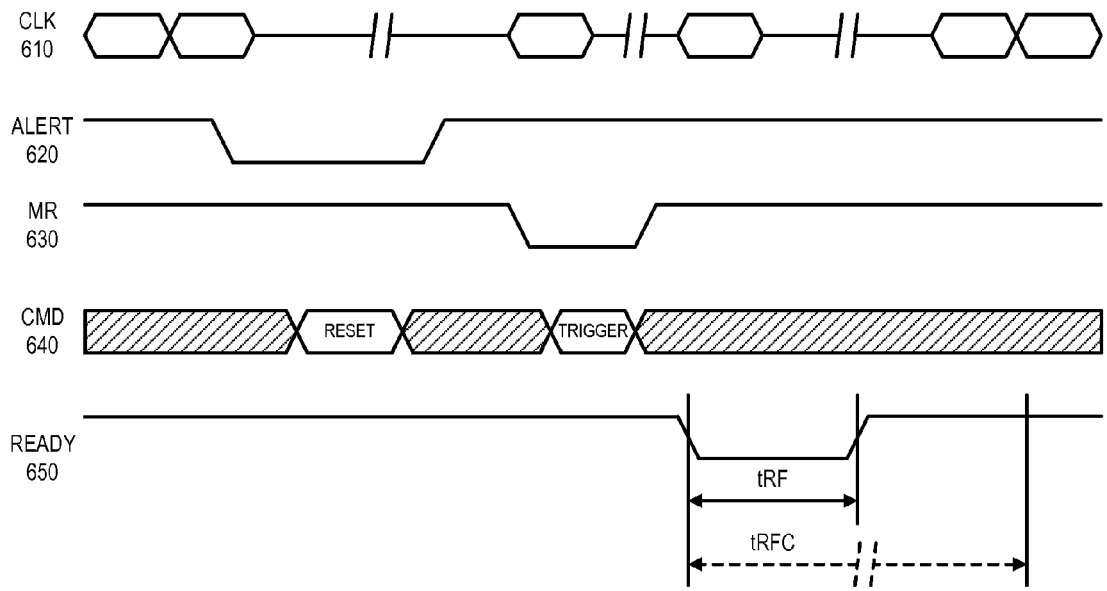
FIG. 6A is a timing diagram of an embodiment of signaling that illustrates timing for a targeted refresh command in response to an alert signal.
Figure 6B:
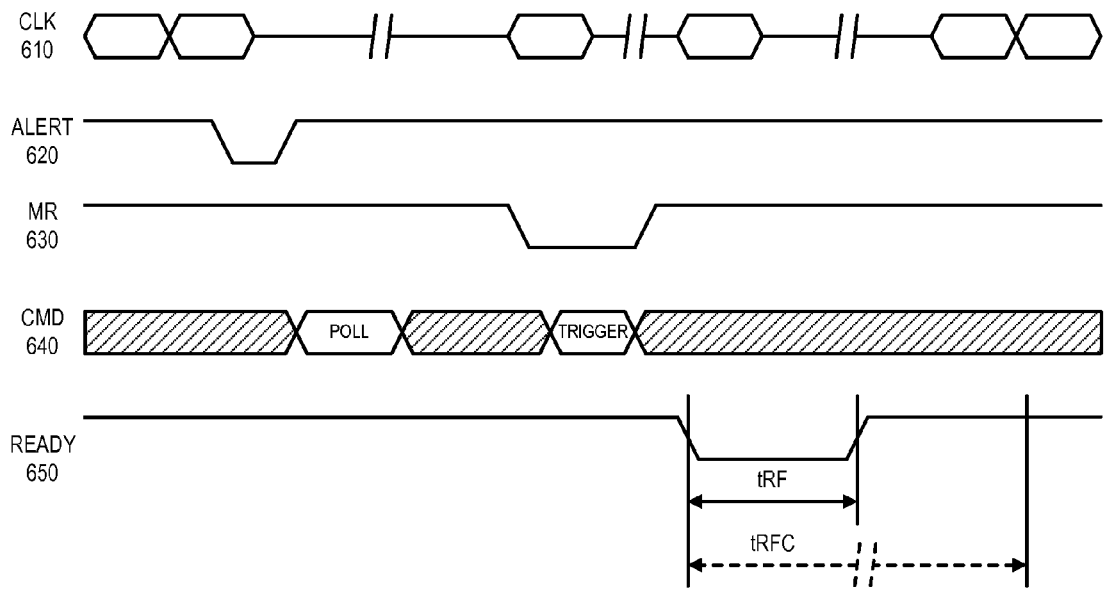
FIG. 6B is a timing diagram of an embodiment of signaling that illustrates timing for a targeted refresh command in response to a pulsed alert signal.

FIGS. 6A-6B illustrate timing diagrams for alternative embodiments of alert signaling to indicate a row hammer event for which a targeted refresh is generated.

Referring to FIG. 6A, clock signal CLK 610 illustrates clock cycles in a system that allows a targeted refresh command. Alert 620 represents an alert signal generated by the memory device in response to detecting a row hammer condition. The signal on Alert 620 indicates the row hammer condition to the memory controller. Alert 620 is shown as being set by the memory device, and the memory controller would then reset the alert signal line when processing the alert. For example, Alert 620 can be left asserted until the host clears a control bit in the Register. More than one alert could be triggered on the same alert line, where one (such as row hammer alert) could be indicated by holding the line asserted, while another (e.g., parity errors) could be indicated by a pulse width on the line (such as illustrated in FIG. 6B).

MR 630 represents the timing of a specific Mode Register state. In the case of a targeted refresh command, in one embodiment, a specific refresh or targeted refresh state exists with respect to the Mode Register by setting one or more bits of the Mode Register. In an embodiment where a Mode Register state is used, the Mode Register state is set prior to the targeted refresh command or targeted refresh trigger being sent. As illustrated, the Mode Register state MR 630 is enabled on a falling edge, but could alternatively be enabled on a rising edge.

The signal illustrated as "Ready 650" represents a memory device ready indicator. Ready signal 650 indicates a period of time in which the memory device is inaccessible following a targeted refresh command. Command line 640 illustrates a command "TRIGGER," which represents a targeted refresh command trigger. The trigger could include a specific command, which could be accompanied by address information, or simply a trigger as discussed above.

It will be understood that command line 640 can include multiple commands sent in sequence to generate a targeted refresh, and/or a single command can be separated into multiple commands at the memory device. All commands can be sent or generated while the Mode Register state is active (e.g., set the Mode Register state, send a series of commands, and then reset the Mode Register state). The commands can be sent or generated all together, in which case the memory device can buffer the commands and execute them in the order received, or the memory controller can wait the time tRF to allow the memory device to refresh prior to sending the next command. If the commands are sent or generated in a sequence, the memory device will become unavailable for some time period that could be multiples of tRF. The memory controller typically will not send a command during the refresh time. However, in an embodiment where the memory controller issues multiple commands to trigger the targeted refresh, the memory device and the memory controller can be configured to enable an exception to allow a series of command based on the triggering of the Mode Register state shown in line 630.

For some period of time tRF after the issuance of the targeted refresh command, the memory device will be inaccessible, as seen by the trough in Ready 650. It will be understood that the time period tRF is shorter than a refresh cycle time tRFC, or a time period during which the memory device is unavailable following a generic refresh command. The typical tRFC is somewhere around 300-400 nanoseconds. However, the time for tRF can be an order of magnitude smaller than tRFC. Thus, tRF associated with a targeted refresh command is very low compared to the tRFC associated with a standard refresh command. The inaccessibility of the memory device refers to the fact that there are no additional commands sent during the blocked-out time period while a refresh is taking place (rRFC for a full refresh, tRF for a targeted refresh).

As already mentioned above, the primary distinction between FIGS. 6A and 6B is how the row hammer alert is signaled. Referring specifically to FIG. 6B, Alert 620 illustrates a pulse width. Thus, the line is reset prior to the memory controller issuing a command or setting a register to reset the line. Instead, the memory controller can issue one or more polling commands. For example, the memory controller may need to poll the register device to differentiate from parity errors.

Figure 7:
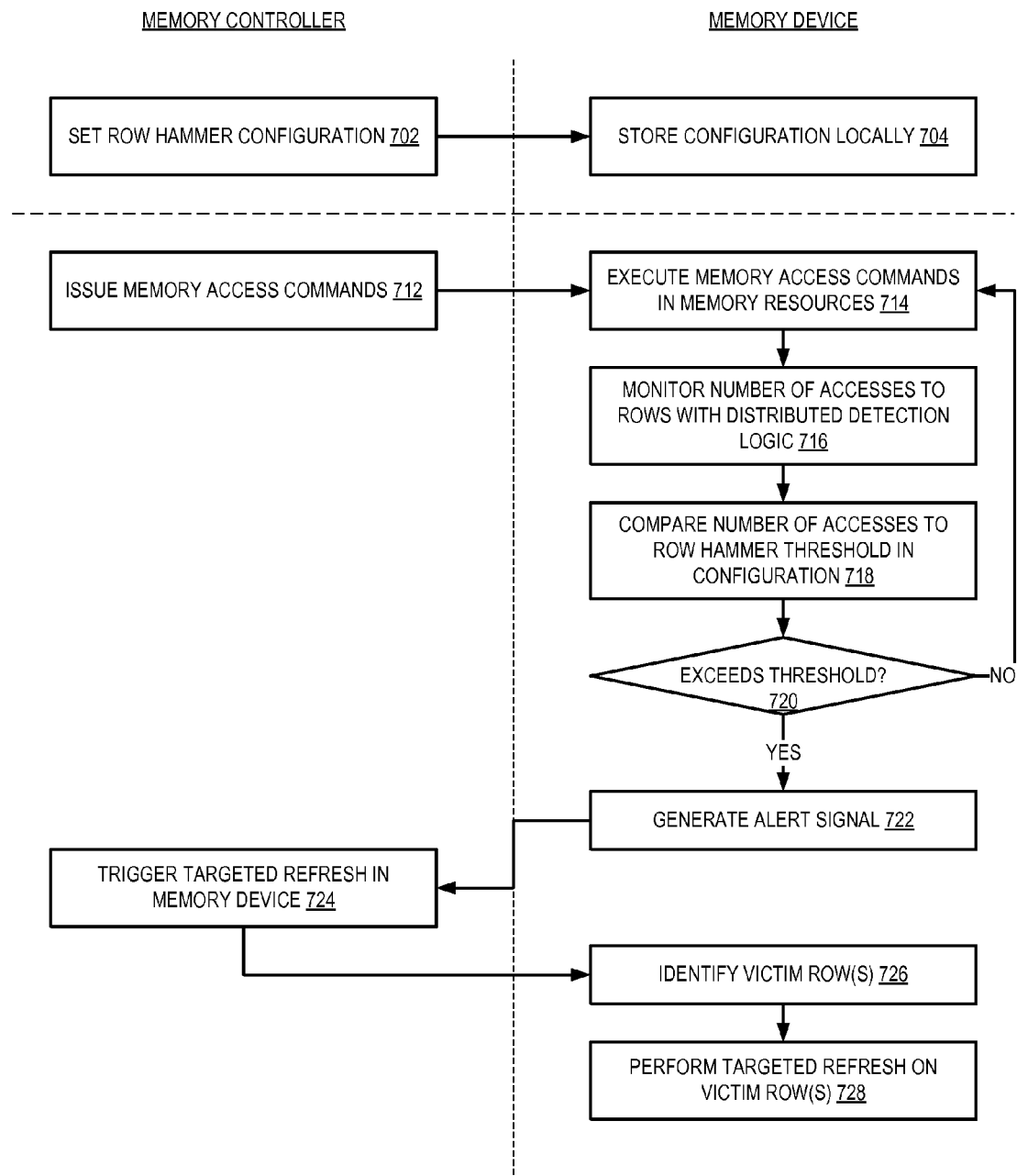
FIG. 7 is a flow diagram of an embodiment of a process for targeted refresh in response to distributed row hammer detection.

FIG. 7 is a flow diagram of an embodiment of a process for targeted refresh in response to distributed row hammer detection. As part of a configuration of the memory subsystem, the memory controller can set one or more row hammer configuration values, 702. The configuration values can be stored by the memory device in one or more local storage locations, such as register, 704. The configuration information can include configuration of the row hammer window and the row hammer access count threshold, or a threshold number of accesses before a row hammer condition is triggered.

In operation of the system, when the memory controller send memory access commands and information to the memory device, 712, the memory device typically executes the memory access commands in the memory resources, 714. The memory device monitors the number of accesses to the rows with distributed detection logic, 716. The monitoring can include comparing the number of accesses to a row to the row hammer threshold set in the configuration information, 718.

If the distributed detection logic determines that the number of accesses to any given row exceeds the row hammer threshold, 720, the memory device generates an alert signal, 722. As mentioned above, the alert signal could be setting a line and waiting for the memory controller to reset the line, or it could be generating a pulse on the signal line. Either form of signaling could be shared with another type of alert or signal, and thus, in one embodiment the memory controller will poll the memory device to determine what alert has been indicated. If the row hammer threshold is not exceeded, 720, the memory device continues to monitor the number of accesses while executing the memory access commands.

When the memory controller determines that a row hammer condition has been triggered from the memory device, it triggers a targeted refresh in the memory device, 724. The trigger can be a specific command, or a trigger to cause the memory device to generate the targeted refresh command. In one embodiment, the memory device identifies the victim row(s), 726, and performs a targeted refresh on the identified victim row(s), 728.

Figure 8:
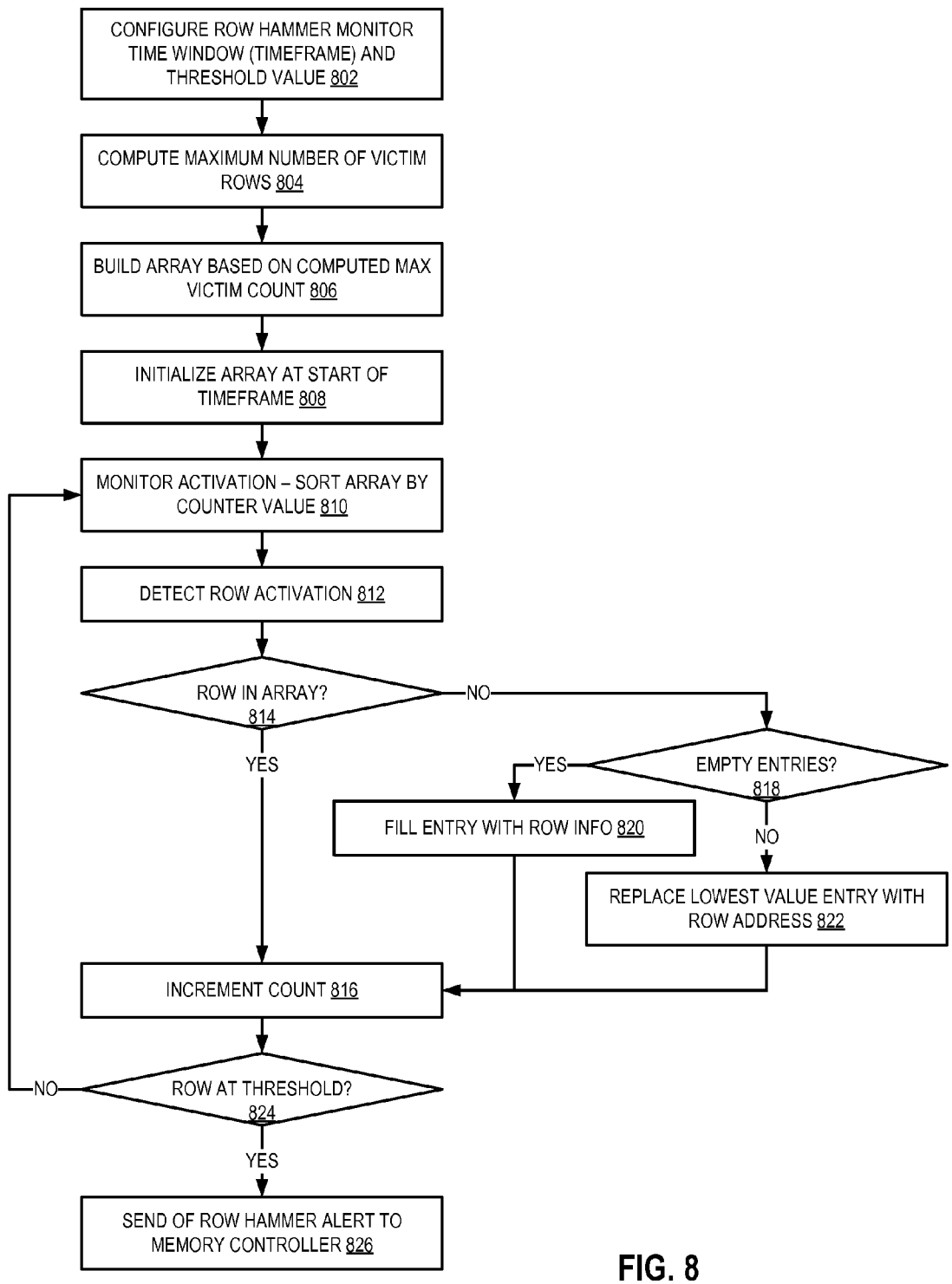
FIG. 8 is a flow diagram of an embodiment of a process for monitoring a row hammer condition of a memory device.

FIG. 8 is a flow diagram of an embodiment of a process for monitoring a row hammer condition of a memory device. The memory device and distributed detection logic can use any mechanism to monitor for row hammer conditions that would indicate when accesses to a row of memory have increased the likelihood of corruption in a victim row beyond what is configured as an acceptable level. Some mechanisms can include keeping a count for only a subset of all rows, instead of keeping a count for all rows. Some mechanisms maintain a table, which could include an ordered table of accesses. Some mechanisms can be based on a computed maximum victim count (MVC). One implementation is described as follows.

An administrator can configure a memory subsystem with a row hammer monitor time window or timeframe, and a threshold value of accesses that indicates a row hammer condition, 802. The administrator can pre-configure the system to receive inputs that indicate the timeframe and threshold values. In one embodiment, the configuring is part of setting register values or configuration in firmware for the memory subsystem. The system includes a detector or detection logic configured to perform monitoring for the timeframe, monitoring for the threshold number of accesses.

Thus, the timeframe and number of accesses are defined in the system. In one embodiment, the timeframe is 64 milliseconds. The number of accesses that make up the threshold depend on the architecture of the memory device to which the memory controller is connected, including the size of the memory and the density of the memory (e.g., the minimum process feature size). The number of accesses that indicate a row hammer event can be somewhere in the range of 150K to 550K accesses during the time window.

The memory controller or detector can compute the maximum number of victim rows that are possible in the system, 804. The operations described below could be considered to be performed by the detector or the memory controller, depending on the implementation. For simplicity in description, the below description refers to operations by the detector, but will be understood as being able to be performed by either the detector, or the memory controller, or both, or that the detector can be part of the memory controller. The administrator could alternatively compute the maximum number of victim rows. The computation is based on determining what the maximum number of rows is that could be accessed the threshold number of times in the timeframe. As one simple example, consider a system in which the number of accesses that defines the threshold is 250K, and the timeframe is 64 ms. If each access takes somewhere on the order of 10 ns, then the maximum number of victim rows is approximated by 26 (64 ms/(250K*10 ns)=25.6). The maximum number of victims can be referred to as MVC (maximum victim count). It will be observed that this number of orders of magnitude smaller than the simple case of monitoring each row individually.

In one embodiment, the detector builds an array of entries based on the value of MVC, 806. The array can be a table or log or other structure. In one embodiment, the number of entries is at least MVC+1. The number of entries could be some multiple of MVC. In one embodiment, each entry of the table or log includes a row address accessible by CAM (content addressable memory) and an access count value. It will be understood that CAM allows access based on comparison of addresses. Other information could also be included in the entries.

In one embodiment, the detector initializes the array at the start of the timeframe, 808. The initialization can include a number of different operations. In one embodiment, on the start of a timeframe, the detector initializes each entry of the array to non-valid (e.g., by setting a flag or entering a value in the entry, or keeping a bitmap of valid entries separate from the array). In one embodiment, the detector resets the count value of each entry to zero.

In one embodiment, the detector can monitor each row by activation that identifies the row in the address fields of the Activate command (e.g., using CAM), 810. In one embodiment, the detector sorts the array by order of counter values (e.g., highest to lowest or lowest to highest). The sorting of the array can be accomplished by a sort, linked list, or other mechanism.

For every new activation of a row detected by the detector, 812, the detector can determine if the row is already in the array, 814. If the row is in the array (Yes branch), the detector increments the count for that entry, 816. There can be an additional requirement of having the entry also be valid (thus, increment if the row is in the array, and the entry is valid). There can be many ways of dealing with the situation where a row is not already in the array (No branch of 814). In one embodiment, the detector determines if there are empty entries or invalid entries available in the array, 818.

If there is an available entry in the array (Yes branch), the detector fills the entry with the information associated with the row for which an activation was detected, 820. As needed for the specific implementation, the detector can also mark the entry as valid. The detector then increments the count for the entry, 816.

If there is not an available entry in the array (No branch of 818), the detector can replace the entry with the lowest access count value with the row address of the row for which the activation was detected, 822. In one embodiment, the access count in the entry is specifically not reset or zeroed. Rather, the address information for the entry is replaced for the row that was just activated. It will be understood that certain rows in memory could be repeatedly accessed, but the repeated access count could dither back and forth with access to another entry. Thus, by keeping the access count and incrementing it, it is almost certainly higher than the number of accesses for the row, but it will never be lower than the true number of accesses.

Thus, the detector keeps the previous access count value or row count, and increments it, 816. It will be understood that the simplest form of incrementing is by increasing the row count by 1 each time, but other forms of incrementing could be used. After incrementing, 816, the detector determines if the row count is at the maximum count, or whether the row has reached the threshold, 824. In one embodiment, the detector checks to see if the threshold is reach every time it detects a row activation, but other implementations are possible. In particular, for newly added entries, there may be no need to check the count against the threshold.

Regardless of the implementation, when the detector determines if the row is at the threshold, 824, if the row has not reached the threshold (No branch), the detector keeps monitoring, 810. If the row has reach the threshold (Yes branch), the detector indicates the address information of the row to the memory controller for the triggering of a targeted refresh command, 826. In one embodiment, when an entry reaches the threshold, the detector also resets the smallest count value of the entry to the smallest count value of any entry in the array. Again, such an action prevents the array from losing count information for an entry that is being repeatedly accessed, but at least initially is not being accessed as frequently as other rows. The detector can also clear the valid bit of the entry.

It will be understood that the operations described herein tend to "float up" the most frequently access rows. When implemented as described, there should not ever be a circumstance where there is a row whose actual access count is larger than the smallest access count of any entry in the array or list. Additionally, the risk of false alarms is limited due to the fact that the number of rows causing the target refresh cannot exceed the value of MVC.

Figure 9:
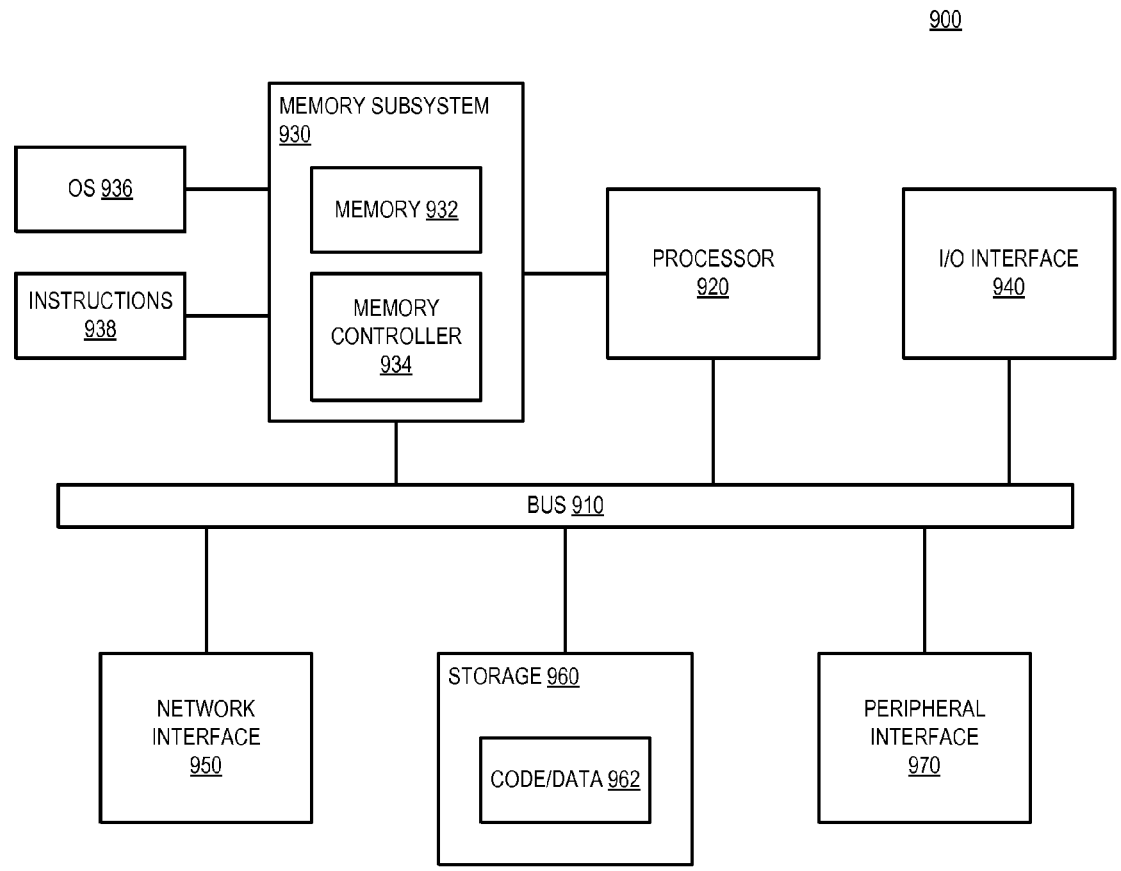
FIG. 9 is a block diagram of an embodiment of a computing system in which targeted refresh can be implemented.

FIG. 9 is a block diagram of an embodiment of a computing system in which targeted refresh can be implemented. System 900 represents a computing device in accordance with any embodiment described herein, and can be a laptop computer, a desktop computer, a server, a gaming or entertainment control system, a scanner, copier, printer, or other electronic device. System 900 includes processor 920, which provides processing, operation management, and execution of instructions for system 900. Processor 920 can include any type of microprocessor, central processing unit (CPU), processing core, or other processing hardware to provide processing for system 900. Processor 920 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 930 represents the main memory of system 900, and provides temporary storage for code to be executed by processor 920, or data values to be used in executing a routine. Memory subsystem 930 can include one or more memory devices such as read-only memory (ROM), flash memory, one or more varieties of random access memory (RAM), or other memory devices, or a combination of such devices. Memory subsystem 930 stores and hosts, among other things, operating system (OS) 936 to provide a software platform for execution of instructions in system 900. Additionally, other instructions 938 are stored and executed from memory subsystem 930 to provide the logic and the processing of system 900. OS 936 and instructions 938 are executed by processor 920.

Memory subsystem 930 includes memory device 932 where it stores data, instructions, programs, or other items. In one embodiment, memory subsystem includes memory controller 934, which is a memory controller in accordance with any embodiment described herein, and which provides a targeted refresh command to memory device 932 based on a row hammer condition. The targeted refresh command causes memory device 932 to perform a targeted refresh, which is a refresh operation off-cycle, meaning it is not on the regularly scheduled cycle of refreshes, and is not necessarily on an area tracked by the memory device as the next area to refresh. Rather, the region refreshed is based on a victim row or region identified based on an address associated with the targeted refresh command(s). Memory controller 934 can trigger a targeted refresh in memory 932 in response to detection by distributed detection logic in accordance with any embodiment described herein.

Processor 920 and memory subsystem 930 are coupled to bus/bus system 910. Bus 910 is an abstraction that represents any one or more separate physical buses, communication lines/interfaces, and/or point-to-point connections, connected by appropriate bridges, adapters, and/or controllers. Therefore, bus 910 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 910 can also correspond to interfaces in network interface 950.

System 900 also includes one or more input/output (I/O) interface(s) 940, network interface 950, one or more internal mass storage device(s) 960, and peripheral interface 970 coupled to bus 910. I/O interface 940 can include one or more interface components through which a user interacts with system 900 (e.g., video, audio, and/or alphanumeric interfacing). Network interface 950 provides system 900 the ability to communicate with remote devices (e.g., servers, other computing devices) over one or more networks. Network interface 950 can include an Ethernet adapter, wireless interconnection components, USB (universal serial bus), or other wired or wireless standards-based or proprietary interfaces.

Storage 960 can be or include any conventional medium for storing large amounts of data in a nonvolatile manner, such as one or more magnetic, solid state, or optical based disks, or a combination. Storage 960 holds code or instructions and data 962 in a persistent state (i.e., the value is retained despite interruption of power to system 900). Storage 960 can be generically considered to be a "memory," although memory 930 is the executing or operating memory to provide instructions to processor 920. Whereas storage 960 is nonvolatile, memory 930 can include volatile memory (i.e., the value or state of the data is indeterminate if power is interrupted to system 900).

Peripheral interface 970 can include any hardware interface not specifically mentioned above. Peripherals refer generally to devices that connect dependently to system 900. A dependent connection is one where system 900 provides the software and/or hardware platform on which operation executes, and with which a user interacts.

Figure 10:
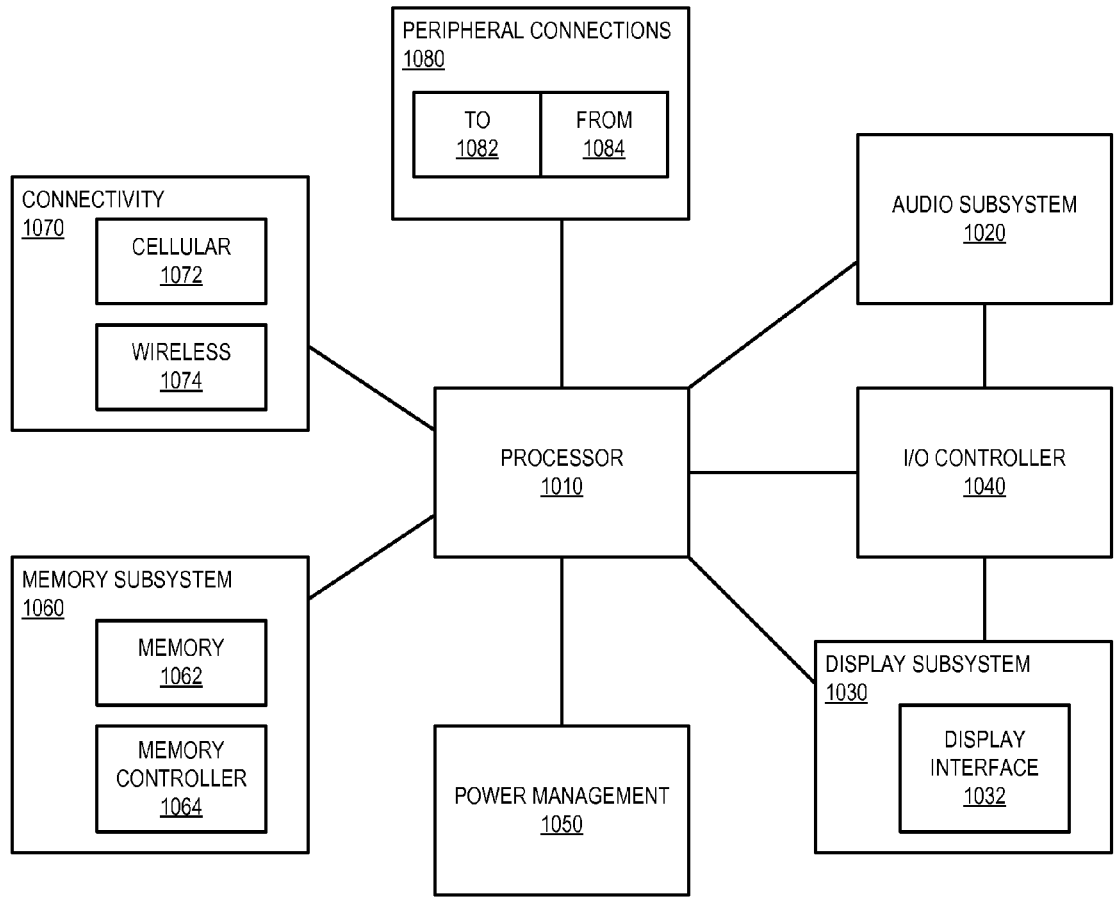
FIG. 10 is a block diagram of an embodiment of a mobile device in which targeted refresh can be implemented.

FIG. 10 is a block diagram of an embodiment of a mobile device in which targeted refresh can be implemented. Device 1000 represents a mobile computing device, such as a computing tablet, a mobile phone or smartphone, a wireless-enabled e-reader, or other mobile device. It will be understood that certain of the components are shown generally, and not all components of such a device are shown in device 1000.

Device 1000 includes processor 1010, which performs the primary processing operations of device 1000. Processor 1010 can include one or more physical devices, such as microprocessors, application processors, microcontrollers, programmable logic devices, or other processing means. In one embodiment, processor 1010 includes optical interface components in addition to a processor die. Thus, the processor die and photonic components are in the same package. Such a processor package can interface optically with an optical connector in accordance with any embodiment described herein.

The processing operations performed by processor 1010 include the execution of an operating platform or operating system on which applications and/or device functions are executed. The processing operations include operations related to I/O (input/output) with a human user or with other devices, operations related to power management, and/or operations related to connecting device 1000 to another device. The processing operations can also include operations related to audio I/O and/or display I/O.

In one embodiment, device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1000, or connected to device 1000. In one embodiment, a user interacts with device 1000 by providing audio commands that are received and processed by processor 1010.

Display subsystem 1030 represents hardware (e.g., display devices) and software (e.g., drivers) components that provide a visual and/or tactile display for a user to interact with the computing device. Display subsystem 1030 includes display interface 1032, which includes the particular screen or hardware device used to provide a display to a user. In one embodiment, display interface 1032 includes logic separate from processor 1010 to perform at least some processing related to the display. In one embodiment, display subsystem 1030 includes a touchscreen device that provides both output and input to a user.

I/O controller 1040 represents hardware devices and software components related to interaction with a user. I/O controller 1040 can operate to manage hardware that is part of audio subsystem 1020 and/or display subsystem 1030. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of device 1000. Additionally, audio output can be provided instead of or in addition to display output. In another example, if display subsystem includes a touchscreen, the display device also acts as an input device, which can be at least partially managed by I/O controller 1040. There can also be additional buttons or switches on device 1000 to provide I/O functions managed by I/O controller 1040.

In one embodiment, I/O controller 1040 manages devices such as accelerometers, cameras, light sensors or other environmental sensors, gyroscopes, global positioning system (GPS), or other hardware that can be included in device 1000. The input can be part of direct user interaction, as well as providing environmental input to the system to influence its operations (such as filtering for noise, adjusting displays for brightness detection, applying a flash for a camera, or other features).

In one embodiment, device 1000 includes power management 1050 that manages battery power usage, charging of the battery, and features related to power saving operation. Memory subsystem 1060 includes memory device(s) 1062 for storing information in device 1000. Memory subsystem 1060 can include nonvolatile (state does not change if power to the memory device is interrupted) and/or volatile (state is indeterminate if power to the memory device is interrupted) memory devices. Memory 1060 can store application data, user data, music, photos, documents, or other data, as well as system data (whether long-term or temporary) related to the execution of the applications and functions of system 1000.

In one embodiment, memory subsystem 1060 includes memory controller 1064 (which could also be considered part of the control of system 1000, and could potentially be considered part of processor 1010). Memory controller 1064 issues a targeted refresh command based on a row hammer condition at a specific row of memory of memory device 1062. Memory controller 1064 can trigger a targeted refresh in memory 1032 in response to detection by distributed detection logic in accordance with any embodiment described herein.

Connectivity 1070 includes hardware devices (e.g., wireless and/or wired connectors and communication hardware) and software components (e.g., drivers, protocol stacks) to enable device 1000 to communicate with external devices. The device could be separate devices, such as other computing devices, wireless access points or base stations, as well as peripherals such as headsets, printers, or other devices.

Connectivity 1070 can include multiple different types of connectivity. To generalize, device 1000 is illustrated with cellular connectivity 1072 and wireless connectivity 1074.

Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading and/or uploading, changing, synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a memory subsystem includes hardware connectors to couple to a memory device having multiple rows of memory and detection logic distributed over multiple logical portions of the memory device; and, a memory controller coupled to the hardware connectors, the memory controller to receive an indication from the memory device via the hardware connectors that repeated access to a specific row of memory is detected by the distributed detection logic distributed to exceed a threshold number of accesses within a time window; and send a trigger to the memory device to perform a targeted refresh, the trigger to cause the memory device to perform a refresh targeted to a victim row physically adjacent to the row for which the number of accesses exceeded the threshold.

In one embodiment, the memory controller is to receive an alert pulse from the memory device, and poll the memory device in response to the alert pulse to determine that the repeated access exceeds the threshold number of accesses within the time window. In one embodiment, the memory controller is to receive an alert set signal from the memory device, determine in response to the alert set signal that that the repeated access exceeds the threshold number of accesses within the time window, and then reset the alert signal. In one embodiment, the memory controller is to send the trigger to the memory device by setting a register to cause the memory device to perform the targeted refresh.

In one embodiment, the memory subsystem further includes the memory controller to identify an address of the row of memory in response to receiving the indication. In one embodiment, the memory controller is to identify the address of the row of memory by identifying a specific physical address for the specific row. In one embodiment, the memory controller is to identify the address of the row of memory by identifying an address range that includes the address for the specific row.

In one aspect, a memory subsystem includes a memory device having multiple rows of memory and detection logic distributed over multiple logical portions of the memory device, the detection logic to, for each logical portion, monitor accesses to rows of the portion for a time period; compare the number of accesses for the rows to a threshold value defined for the memory device to determine if a number of accesses for any of the rows exceeds the threshold value; and generate an alert signal to a memory controller when the number of accesses to a row exceeds the threshold in the time period; and hardware connectors to couple to a memory controller, the memory controller to generate a targeted refresh trigger to cause the memory device to perform a refresh targeted to a victim row physically adjacent to the row for which the number of accesses exceeded the threshold.

In one embodiment, the detection logic comprises logic in a command/address (C/A) processing device. In one embodiment, the C/A processing device comprises a C/A register. In one embodiment, the C/A processing device comprises a C/A buffer. In one embodiment, the multiple logical portions comprise multiple memory channels. In one embodiment, the multiple logical portions comprise multiple memory modules. In one embodiment, the multiple logical portions comprise multiple ranks of memory.

In one embodiment, the detection logic, for each logical portion, is to monitor accesses by keeping a count for only a subset of all rows, and incrementing the count for the selected rows for each access. In one embodiment, the detection logic, for each logical portion, is to maintain an ordered table of access counts to monitor the accesses, and is to compare the access counts to the threshold, wherein the table is ordered by sorting the table by order of access count value, and wherein a number of entries in the table is based on the maximum victim count. In one embodiment, the detection logic is to generate an alert pulse, receive a polling request from the memory controller in response to the alert pulse, and indicate a row hammer event in response to the polling request.

In one embodiment, the detection logic is to generate an alert set signal to indicate a row hammer event to the memory controller. In one embodiment, the detection logic is to identify a specific address of the row for which the number of accesses exceeded the threshold value in response to the targeted refresh command from the memory controller.

In one aspect, an electronic device includes a memory subsystem having a memory device having multiple rows of memory and detection logic distributed over multiple logical portions of the memory device, the detection logic to, for each logical portion, monitor accesses to rows of the portion for a time period; compare the number of accesses for the rows to a threshold value defined for the memory device to determine if a number of accesses for any of the rows exceeds the threshold value; and generate an alert signal to a memory controller when the number of accesses to a row exceeds the threshold in the time period; and a memory controller coupled the memory device, the memory controller to receive the alert signal; and send a trigger to the memory device to cause the memory device to perform a targeted refresh in response to receiving the alert signal, the targeted refresh targeted to a victim row physically adjacent to the row for which the number of accesses exceeded the threshold. The electronic device also includes a multicore processor coupled to the memory subsystem to access the memory subsystem during execution of the processor.

In one embodiment, the detection logic comprises logic in a command/address (C/A) processing device. In one embodiment, the multiple logical portions comprise one of multiple memory channels, multiple memory modules, or multiple ranks of memory. In one embodiment, the detection logic, for each logical portion, is to maintain an ordered table of access counts to monitor the accesses, and is to compare the access counts to the threshold, wherein the table is ordered by sorting the table by order of access count value, and wherein a number of entries in the table is based on the maximum victim count. In one embodiment, the detection logic is to generate an alert set signal to indicate a row hammer event to the memory controller. In one embodiment, the memory controller is to send the command to the memory device by setting a register to cause the memory device to perform the targeted refresh.

In one aspect, a method includes monitoring accesses to rows of a portion of a memory device for a time period with detection logic distributed over multiple logical portions of the memory device; comparing the number of accesses for the rows to a threshold value defined for the memory device to determine if a number of accesses for any of the rows exceeds the threshold value; generating an alert signal from the memory device to a memory controller when the number of accesses to a row exceeds the threshold in the time period; and performing a refresh targeted to a victim row physically adjacent to a victim row physically adjacent to the row for which the number of accesses exceeded the threshold, in response to a targeted refresh trigger from the memory controller.

In one embodiment, distributed detection logic comprises logic in a command/address (C/A) processing device. In one embodiment, monitoring accesses to the rows of the portion comprises monitoring accesses to rows of one of multiple memory channels, one of multiple memory modules, or one of multiple ranks of memory. In one embodiment, generating the alert signal comprises generating an alert set signal to be reset by the memory controller.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller, comprising:
   an interface to couple to a memory subsystem, the memory controller to:
   a) receive row hammer indication from the memory subsystem via the interface that repeated access to a specific row of memory is detected by distributed detection logic to exceed a threshold number of accesses within a time window, the distributed detection logic partitioned to detect threshold excesses according to at least one of the following distributed architectures:
      a separate instance of row access detection logic circuitry to separately identify a row hammer condition for each of multiple channels so as to consolidate generation points of row hammer indications sent to the memory controller, each memory channel comprising multiple memory semiconductor chips;
      a separate instance of row access detection logic circuitry to separately identify a row hammer condition for each of multiple memory modules so as to consolidate generation points of row hammer indications sent to the memory controller, each memory module comprising multiple memory semiconductor chips;
      a separate instance of row access detection logic circuitry to separately identify a row hammer condition for each of multiple ranks so as to consolidate generation points of row hammer indications sent to the memory controller, each rank comprising multiple memory semiconductor chips; and,
   b) send a trigger to the memory subsystem to perform a targeted refresh, the trigger to cause the memory subsystem to perform a refresh targeted to a victim row physically adjacent to the row for which the number of accesses exceeded the threshold.

2. The memory controller of claim 1, wherein the memory controller is to receive a row hammer indication in the form of an alert pulse from the memory subsystem, and poll the memory subsystem in response to the alert pulse to determine that the repeated access exceeds the threshold number of accesses within the time window.

3. The memory controller of claim 1, wherein the memory controller is to receive a row hammer indication in the form of an alert set signal from the memory subsystem, determine in response to the alert set signal that the repeated access exceeds the threshold number of accesses within the time window, and then reset the alert signal.

4. The memory controller of claim 1, wherein the memory controller is to send the trigger to the memory subsystem by setting a register to cause the memory subsystem to perform the targeted refresh.

5. The memory controller of claim 1, wherein the memory controller is further to identify an address of the row of memory in response to receiving the indication.

6. The memory controller of claim 5, wherein the memory controller is to identify the address of the row of memory by identifying a specific physical address for the specific row.

7. The memory controller of claim 5, wherein the memory controller is to identify the address of the row of memory by identifying an address range that includes the address for the specific row.

8. An apparatus, comprising:
 a) memory subsystem detection logic to couple to a memory controller, the memory subsystem detection logic being distributed over multiple logical portions of memory resources according to at least one of the following distributed architectures:
  a separate instance of row access detection logic circuitry to separately identify a row hammer condition for each of multiple channels so as to consolidate generation points of row hammer indications sent back to the memory controller, each of the multiple channels comprising multiple memory semiconductor chips;
  a separate instance of row access detection logic circuitry to separately identify a row hammer condition for each of multiple memory modules so as to consolidate generation points of row hammer indications sent back to the memory controller, each of the multiple memory modules comprising multiple memory semiconductor chips;
  a separate instance of row access detection logic circuitry to separately identify a row hammer condition for each of multiple ranks so as to consolidate generation points of row hammer indications sent back to the memory controller, each of the multiple ranks comprising multiple memory semiconductor chips;
  the detection logic to, for each logical portion,
   monitor accesses to rows of the portion for a time period;
   compare the number of accesses for the rows to a threshold value defined for the memory resources to determine if a number of accesses for any of the rows exceeds the threshold value; and
   send a row hammer indication to the memory controller when the number of accesses to a row exceeds the threshold in the time period; and
 b) logic circuitry to cause the memory resources, responsive to a targeted refresh trigger sent from the memory controller, to perform a refresh targeted to a victim row physically adjacent to the row for which the number of accesses exceeded the threshold.

9. The apparatus of claim 8, wherein the detection logic comprises logic in a command/address (C/A) processing resource.

10. The apparatus of claim 9, wherein the C/A processing device comprises a C/A register.

11. The apparatus of claim 9, wherein the C/A processing device comprises a C/A buffer.

12. The apparatus of claim 8, wherein the multiple logical portions comprise multiple memory channels.

13. The apparatus of claim 8, wherein the multiple logical portions comprise multiple memory modules.

14. The apparatus of claim 8, wherein the multiple logical portions comprise multiple ranks of memory.

15. The apparatus of claim 8, wherein the detection logic, for each logical portion, is to monitor accesses by keeping a count for only a subset of all rows, and incrementing the count for the selected rows for each access.

16. The apparatus of claim 8, wherein the detection logic, for each logical portion, is to maintain an ordered table of access counts to monitor the accesses, and is to compare the access counts to the threshold, wherein the table is ordered by sorting the table by order of access count value, and wherein a number of entries in the table is based on the maximum victim count.

17. The apparatus of claim 8, wherein the detection logic is to generate a row hammer indication in the form of an alert pulse, receive a polling request from the memory controller in response to the alert pulse, and indicate a row hammer event in response to the polling request.

18. The apparatus of claim 8, wherein the detection logic is to generate a row hammer indication in the form of an alert set signal to indicate a row hammer event to the memory controller.

19. The apparatus of claim 8, wherein the detection logic is to identify a specific address of the row for which the number of accesses exceeded the threshold value in response to the targeted refresh command from the memory controller.

20. An electronic device comprising:
 a memory subsystem coupled to a memory controller, the memory subsystem comprising
  a memory comprising multiple rows of memory and detection logic distributed over multiple logical portions of the memory according to at least one of the following distributed architectures:
   a separate instance of row access detection logic circuitry to separately identify a row hammer condition for each of multiple channels so as to consolidate generation points of row hammer indications sent to the memory controller, each of the multiple channels comprising multiple memory semiconductor chips;
   a separate instance of row access detection logic circuitry to separately identify a row hammer condition for each of multiple memory modules so as to consolidate generation points of row hammer indications sent to the memory controller, each of the multiple channels comprising multiple memory semiconductor chips;
   a separate instance of row access detection logic circuitry to separately identify a row hammer condition for each of multiple ranks so as to consolidate generation points of row hammer indications sent to the memory controller, each of the multiple ranks comprising multiple memory semiconductor chips;
  the detection logic to, for each logical portion,
   monitor accesses to rows of the portion for a time period;
   compare the number of accesses for the rows to a threshold value defined for the memory to determine if a number of accesses for any of the rows exceeds the threshold value; and
   send a row hammer indication to the memory controller when the number of accesses to a row exceeds the threshold in the time period; and
  the memory controller coupled the memory device, the memory controller to
   receive the row hammer indication; and
   send a trigger to the memory to cause the memory to perform a targeted refresh in response to receiving the row hammer indication, the targeted refresh targeted to a victim row physically adjacent to the row for which the number of accesses exceeded the threshold; and a multicore processor coupled to the memory controller to access the memory subsystem during execution of program code by the processor.

21. The electronic device of claim 20, wherein the detection logic comprises logic in a command/address (C/A) processing device.

22. The electronic device of claim 20, wherein the multiple logical portions comprise one of multiple memory channels, multiple memory modules, or multiple ranks of memory.

23. The electronic device of claim 20, wherein the detection logic, for each logical portion, is to maintain an ordered table of access counts to monitor the accesses, and is to compare the access counts to the threshold, wherein the table is ordered by sorting the table by order of access count value, and wherein a number of entries in the table is based on the maximum victim count.

24. The electronic device of claim 20, wherein the detection logic is to generate a row hammer signal in the form of an alert set signal to indicate a row hammer event to the memory controller.

25. The electronic device of claim 20, wherein the memory controller is to send the command to the memory by setting a register to cause the memory device to perform the targeted refresh.

26. A method comprising:

monitoring accesses to rows of a portion of a memory for a time period with detection logic distributed over multiple logical portions of the memory device according to at least one of the following distributed architectures:

monitoring accesses with a separate instance of row access detection logic circuitry to separately identify a row hammer condition for each of multiple channels, each of the multiple channels comprising multiple memory semiconductor chips;

monitoring accesses with a separate instance of row access detection logic circuitry to separately identify a row hammer condition for each of multiple memory modules, each of the multiple memory modules comprising multiple memory semiconductor chips;

monitoring accesses with a separate instance of row access detection logic circuitry to separately identify a row hammer condition for each of multiple ranks, each of the multiple ranks comprising multiple semiconductor chips;

comparing the number of accesses for the rows to a threshold value defined for the memory to determine if a number of accesses for any of the rows exceeds the threshold value;

generating row hammer indication signals from consolidated generation points as a consequence of the at least one distributed architectures to a memory controller when the number of accesses to a row exceeds the threshold in the time period; and performing a refresh targeted to a victim row physically adjacent to the row for which the number of accesses exceeded the threshold, in response to a targeted refresh trigger from the memory controller.

27. The method of claim 26, wherein the distributed detection logic comprises logic in a command/address (C/A) processing device.

28. The method of claim 26, wherein generating the generating a row hammer indication signal comprises generating an alert set signal to be reset by the memory controller.

* * * * *